(12) United States Patent
Xi (10) Patent No.: US 6,300,831 B1
(45) Date of Patent: Oct. 9, 2001

(54) COMPENSATING A GM-BOOSTED FOLDED-CASCODE AMPLIFIER

(75) Inventor: Xiaoyu Xi, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/468,505

(22) Filed: Dec. 21, 1999

(51) Int. Cl.[7] .................................................... H03F 3/45
(52) U.S. Cl. ...................... 330/252; 330/292; 330/300; 330/311
(58) Field of Search .................................. 330/252, 292, 330/300, 311

(56) References Cited

U.S. PATENT DOCUMENTS 5,039,954 * 8/1991 Bult et al. ............................ 330/311
6,177,838 * 1/2001 Chiu ..................................... 330/311

FOREIGN PATENT DOCUMENTS

2333197 * 7/1999 (GB).

* cited by examiner

*Primary Examiner*—Michael B Shingleton
(74) *Attorney, Agent, or Firm*—Pedro P. Hernandez; W. James Brady, III; Frederick J. Telecky, Jr.

(57) ABSTRACT

A folded-cascode amplifier (30) having a small signal gm being boosted and transferred from the input stage to the output stage to reduce current consumption and expand bandwidth. The amplifier has a pair of second amplifiers (A) operating as boosting amplifiers that provide a pole at its output node, which is at a fairly low frequency. A compensation scheme is employed to introduce a zero to cancel out this pole, and as a side benefit, another zero is brought in which is used to cancel out a second pole of the original folded-cascode amplifier so that bandwidth is actually expanded. Two compensation capacitors (C1, C2) serve two purposes, one, providing a dominant pole to the main amplifier due to a Miller Effect, where the value of the two capacitors are much smaller than for conventional folded-cascode amplifiers, and two, introduce two zeros which cancel out two high frequency poles so that bandwidth is expanded.

18 Claims, 7 Drawing Sheets

COMPENSATING A GM-BOOSTED FOLDED-CASCODE AMPLIFIER

FIELD OF THE INVENTION

The present invention is generally related to operational amplifier circuits, and more particularly to a folded-cascode type amplifier.

BACKGROUND OF THE INVENTION

Operational amplifiers (Op Amps) are integrated circuits commonly used in a variety of electronic applications including the amplification of analog signals. Op Amps are also commonly used in a variety of other circuit designs including filters, integrators, comparators and the like. The Op Amp has two inputs, one being the positive input and generally referenced as the non-inverting input, and a negative input commonly referred to as the inverting input.

One type of operational amplifier is the folded-cascode amplifier. As with most operational amplifiers, it is desired that the power consumption of the overall circuitry comprising the amplifier be kept as low as possible, including the quiescent current. In the case of the folded-cascode amplifier, it is desired to boost the transconductance (Gm) of the amplifier without sacrificing the operating bandwidth of the amplifier. Power consumption is typically increased significantly when ting to increase transconductance.

There is desired an improved folded-cascode amplifier with expanded bandwidth and with reduced power consumption.

SUMMARY OF THE INVENTION

The present invention achieves technical advantages as a folded-cascode amplifier having the small signal transconductance gm of an input stage transferred to the output stage, reducing overall current consumption, and providing expanded bandwidth. The present invention achieves these technical advantages with a main amplifier that may be a PMOS folded-cascode amplifier, and using a second amplifier. A boosting amplifier provides a pole at its output node, which is at a fairly low frequency. A novel compensation scheme is used to introduce a zero to cancel out this pole, and as a side benefit, there is introduced another zero that is used to cancel out a second pole of the original folded-cascode amplifier so that the bandwidth is actually expanded. Boosting amplifiers and two compensation capacitors are provided in the present invention to achieve these technical advantages.

By using a boosting amplifier, and an additional small signal current such as 20 uA, all of the small signal transconductance gm of the input stage is transferred to the output stage, thus eliminating the requirement for an additional 100 uA of current at the input stage for a given transconductance Gm of conventional folded-cascode amplifiers. Two compensation capacitors, serve two purposes. First, they generate a dominant pole to the main amplifier and a little Miller Effect, with the value of these two capacitors being much smaller than for conventional foldedcascode amplifiers. Second, the two compensation capacitors introduce two zeros which cancel out two high frequency poles so that the bandwidth of the amplifier is expanded.

DESCRIPTION OF THE PREFERRED EMBODIMENT

Figure 1:
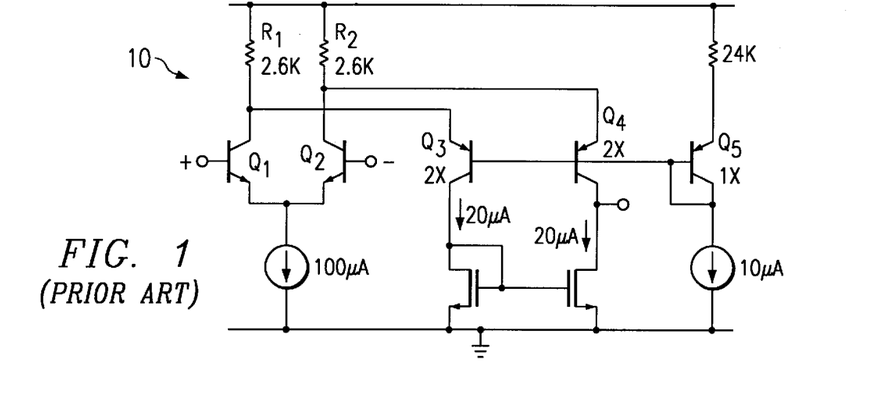
FIG. 1 is a schematic view of a conventional folded-cascode amplifier.

Referring first to FIG. 1, there is illustrated a conventional folded-cascode amplifier as an error amplifier that requires some special requirements, namely, is used for high side current sense, so the two "+" and "−" inputs are virtually at power supply level. A typical specification requires a transconductance Gm of 2 mA/V, and the power consumption should be kept as low as possible. A calibration circuitry is needed to cancel out the input offset. The small signal transconductance gm of transistor Q1 and transistor Q2 is set by bias current as follows:

$$gm = 50 \text{ uA}/28 \text{ mV} = 2 \text{ A/V}.$$

The impedance looking into the emitter of transistors Q3 and Q4 are:

$$Rin = 1/Gm3 = 26 \text{ mV}/20 \text{ uA} = 1.3 \text{ K ohms}$$

The small signal current coming out of transistors Q1 and Q2 will be divided by resistor R1 and transistor Q3 so that the transconductance Gm transfer to the output stage is:

$$R1/(R1+Rin) \times g_{m1}$$

$$2.6 \text{ K}/2.6 \text{ K} + 1.3 \text{ K} \times 2 \text{ mA/V} = 1.33 \text{ MA/V}$$

The bench test of the specification gives the transconductance Gm of 0.8 mA/v.

Figure 2:
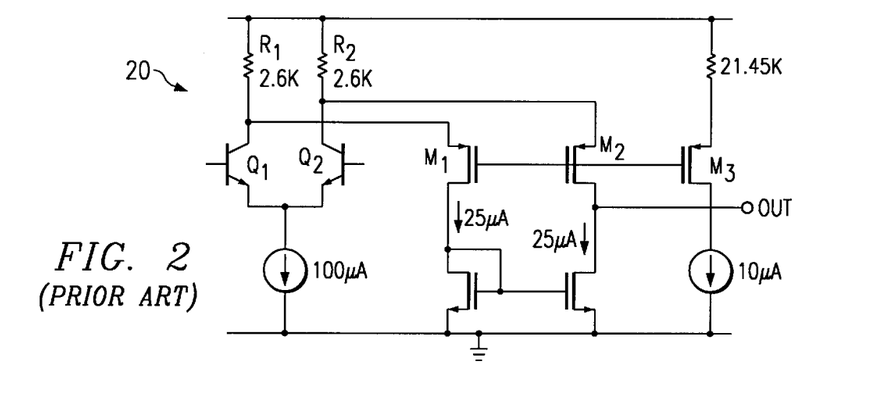
FIG. 2 is a schematic diagram of a conventional folded-cascode amplifier in a pure CMOS process which has an even worse power transconductance, where the present invention is; more desired.

It is noted that the circuit 10 of FIG. 1 uses PNP transistors. For a CMOS implementation, transistors Q3, Q4, and Q5 are changed to PMOS type transistors as shown in FIG. 2 at 20. However, the transconductance Gm will be even worse since normally MOS has much lower Gm than bipolar, unless it uses extremely large PMOS devices. This undesirably will reduce bandwidth of the operational amplifier 20 as shown in FIG. 2 because the second pole of the folded-cascode amplifier is normally at the folding nodes. Another option is to boost the small signal transconductance $g_m$ of both transistors Q1 and Q2, resulting in undesirable higher power consumption.

Referring to FIG. 2, a test version was assimilated using the following sizes:

M1+M2=8(40/4) where the transconductance Gm of this amplifier is about 0.8 mA/V.

Figure 3:
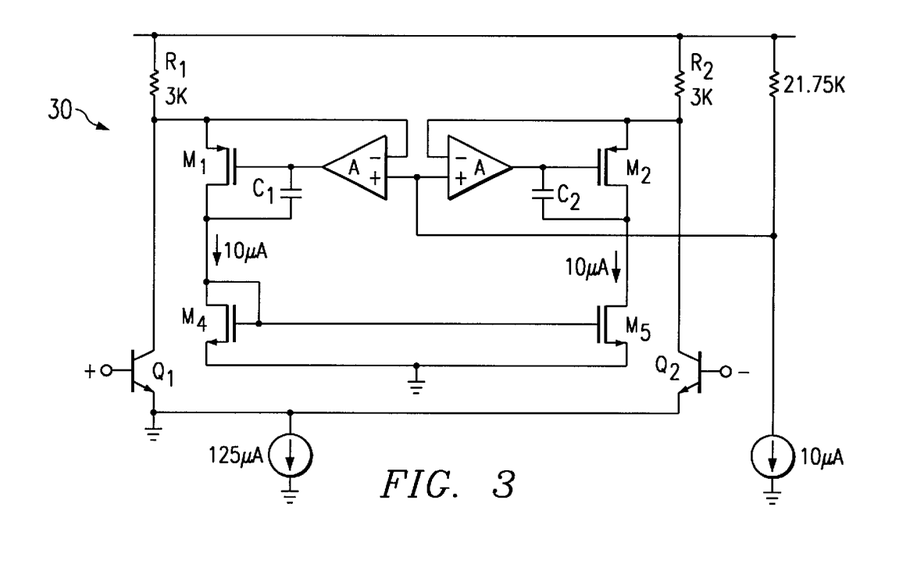
FIG. 3 is a schematic diagram of a folded-cascode amplifier having a boosted transconductance Gm where the small current gm of transistors Q1 and Q2 of FIG. 2 are completely transferred to the output with the help of two additional amplifiers.

The present invention is depicted at 30 in FIG. 3 whereby boosting amplifiers having a gain "A" boost the small signal transconductance $g_m$ of PMOS transistors M1 and M2 so that all small signal current from transistors Q1 and Q2 will be transferred to the output of the amplifier. Now:

$$M1=M2=4(40/4)$$

Figure 4:
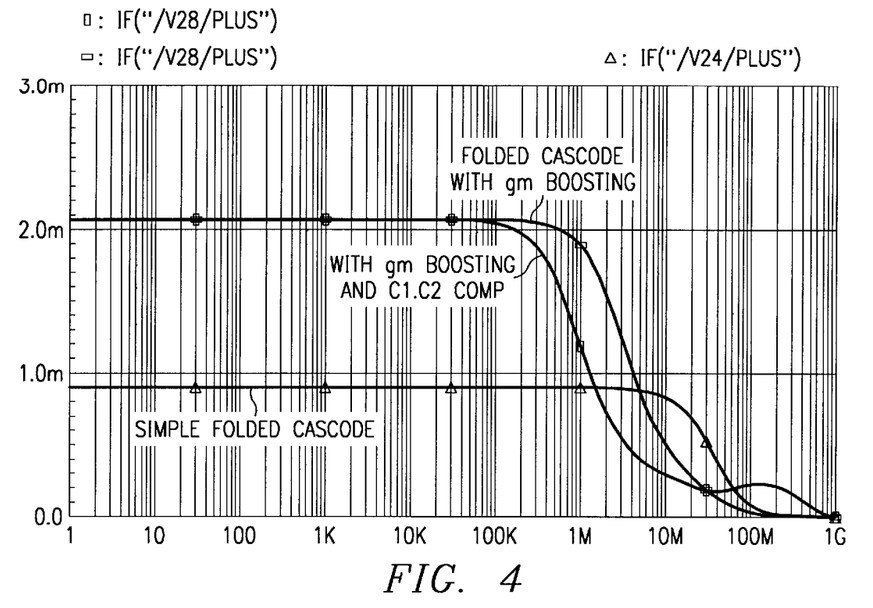
FIG. 4 is a diagram plotting out the overall transconductance of the amplifier/circuit of FIG. 3 as compared to a simple prior art folded-cascode amplifier.
Figure 5:
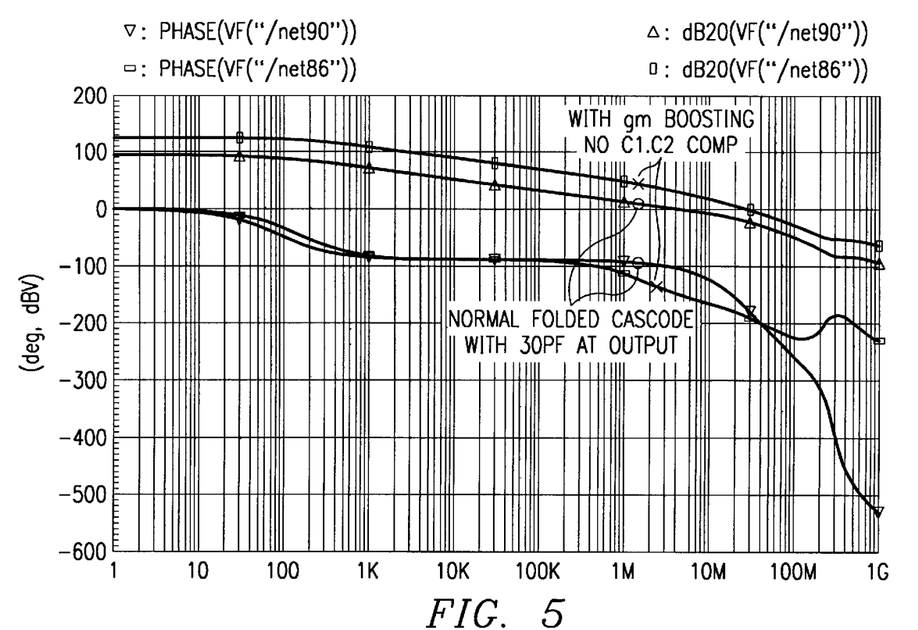
FIG. 5 is a diagram of the frequency response of the amplifier of FIG. 3 without the two compensation capacitors C1 and C2, compare to the conventional folded-cascode amplifier phase margin is worse due to the poles introduced by the two additional amplifiers.

The transconductance Gm of this amplifier is 2 mA/V, and simulation waveforms are attached in FIG. 4. It is noted that the $g_m$ of transistors M1 and M2 are boosted by a factor of gain A. However, the bandwidth of the boosting amplifier A will degrade the frequency response of the main amplifier if no special effort is taken, because the output of the two boosting amplifiers A are high impedance nodes, and the dominant pole should be at the output of the main amplifier so that the two boosting amplifiers A will give fairly low frequency non-dominant poles.

Figure 6:
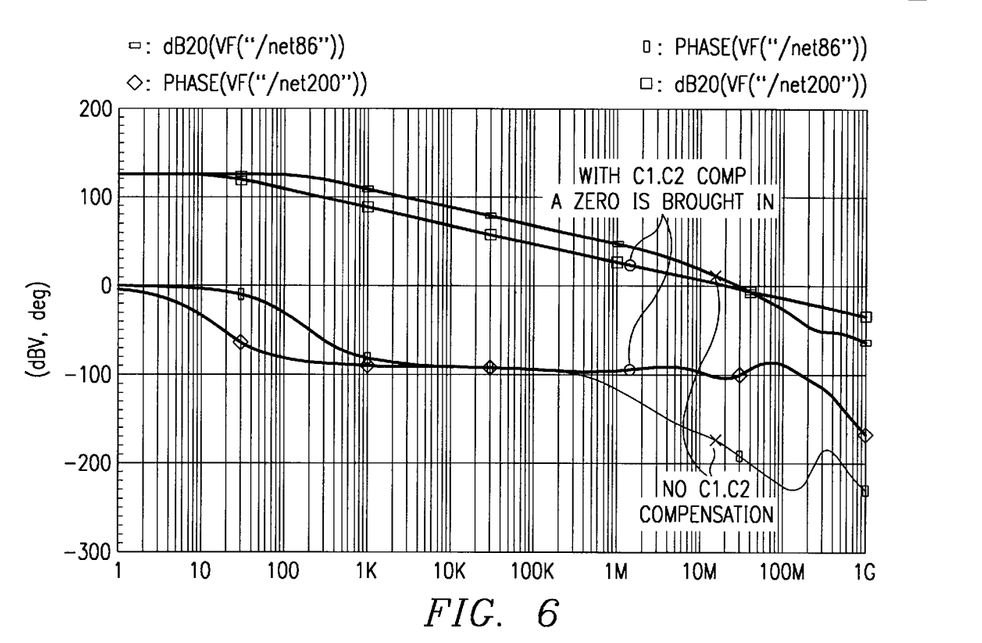
FIG. 6 is a diagram illustrating the frequency response of the circuit of FIG. 3 whereby compensation capacitors C1 and C2 introduce a zero to improve the phase response across an extended operating bandwidth as compared to the Gm boosted amplifier with no compensation capacitors.
Figure 7:
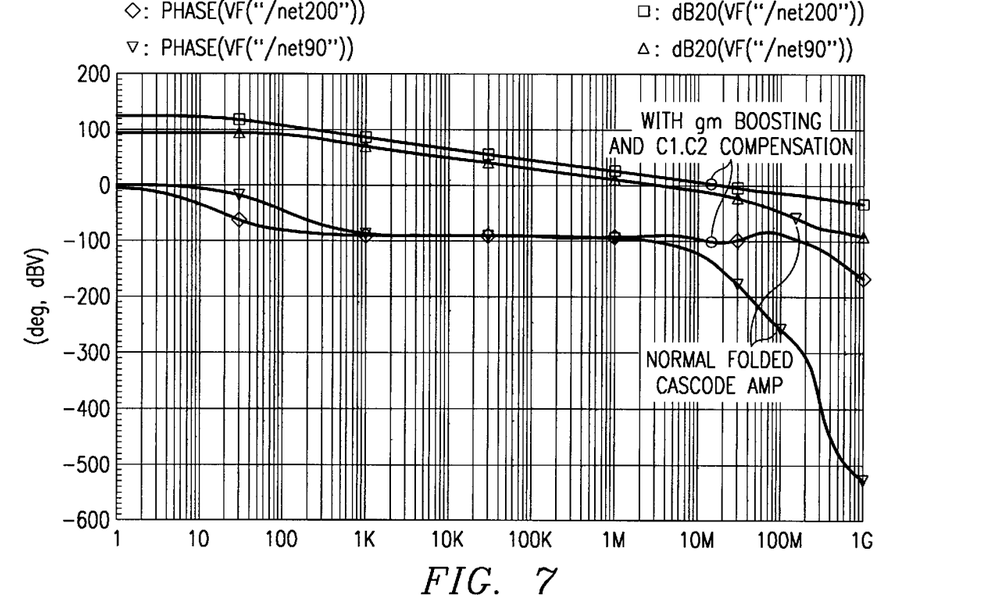
FIG. 7 is a plot of the frequency response of the Gm boosted amplifier using compensation capacitors C1 and C2 as compared to a normal folded-cascode amplifier.

Advantageously, by adding compensation capacitors C1 and C2 across the gate and drain of PMOS transistors M1 and M2, respectively, capacitor C2 gives a dominant pole and a little bit of Miller effect. Compensation capacitor C1 gives a zero which brings back the phase shift at high frequency, as shown in FIG. 6 and FIG. 7. Note that if compensation capacitor C2 was coupled to ground, the phase shift would be as worse as without capacitors C1 and C2.

Further advantages of the present invention can be seen in FIG. 6 and FIG. 7 whereby the upper curves illustrate the phase response of the amplifier with compensation capacitors C1 and C2 generating two zeros, where indicated by the two ripples on the curve with the circle symbol. With the poles being shown by the symbol "X". FIG. 7 illustrates the expanded bandwidth of the amplifier depicted in FIG. 3. The curve with symbol "x" on FIG. 6 shows the phase response of the Gm boosted amplifier without the two compensation caps, where the phase margin is zero at unity gain bandwidth. The curve with symbol "x" FIG. 7 shows the phase response of the conventional folded-cascode amplifier which has a smaller dc gain and bandwidth.

In summary, with small signal $g_m$ boosting, PMOS transistors M1 and M2 transfer all the $g_m$ in the input stage of transistors Q1 and Q2 to the output stage. The compensation capacitors C1 and C2, as shown in FIG. 3, compensate the non-dominant poles introduced by the two boosting amplifiers shown at A. Consequently, gain and bandwidth of the overall folded-cascode amplifier 30 is improved.

Figure 8:
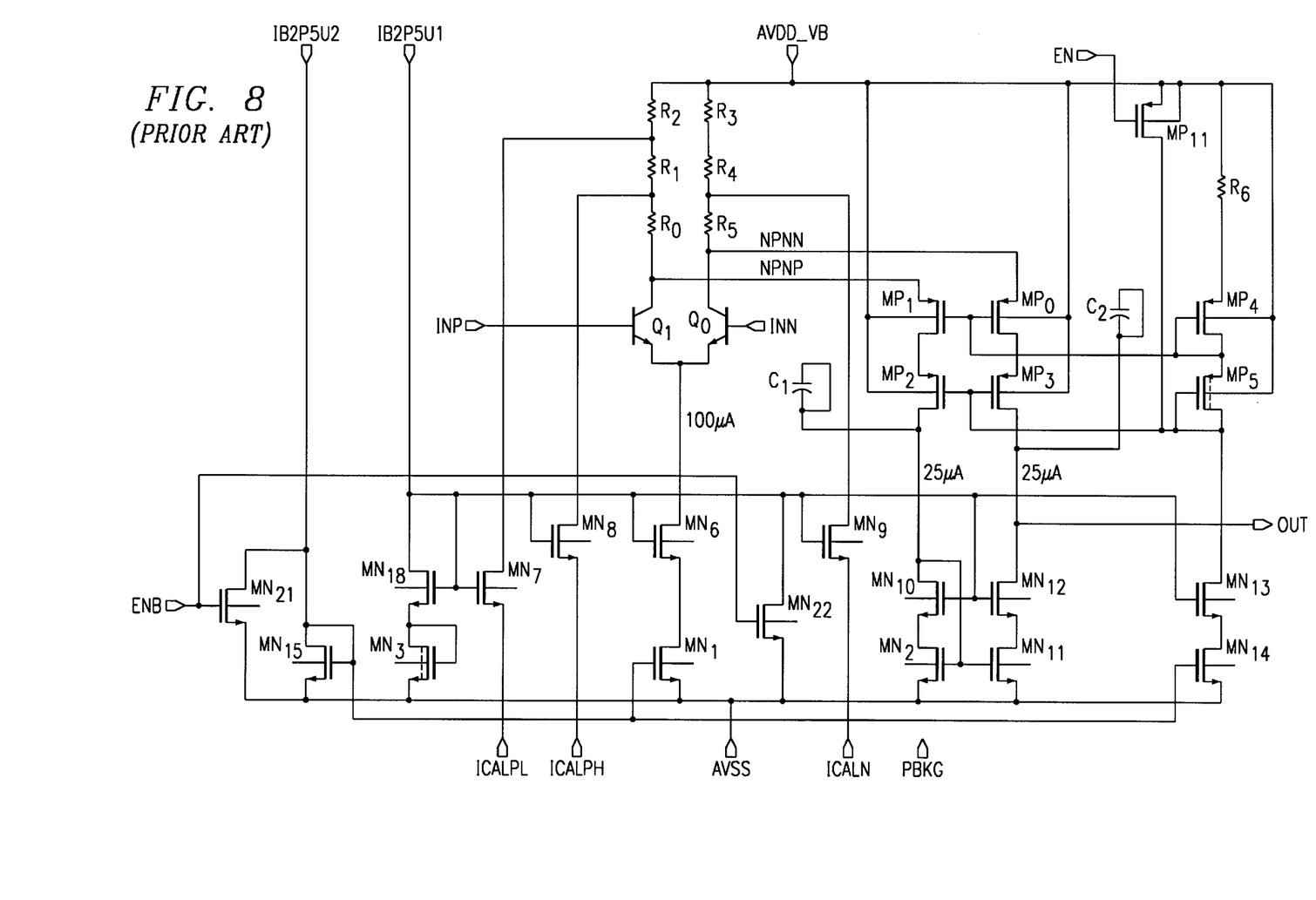
FIG. 8 is a full detailed schematic diagram of a typical conventional folded-cascode amplifier.
Figure 9A:
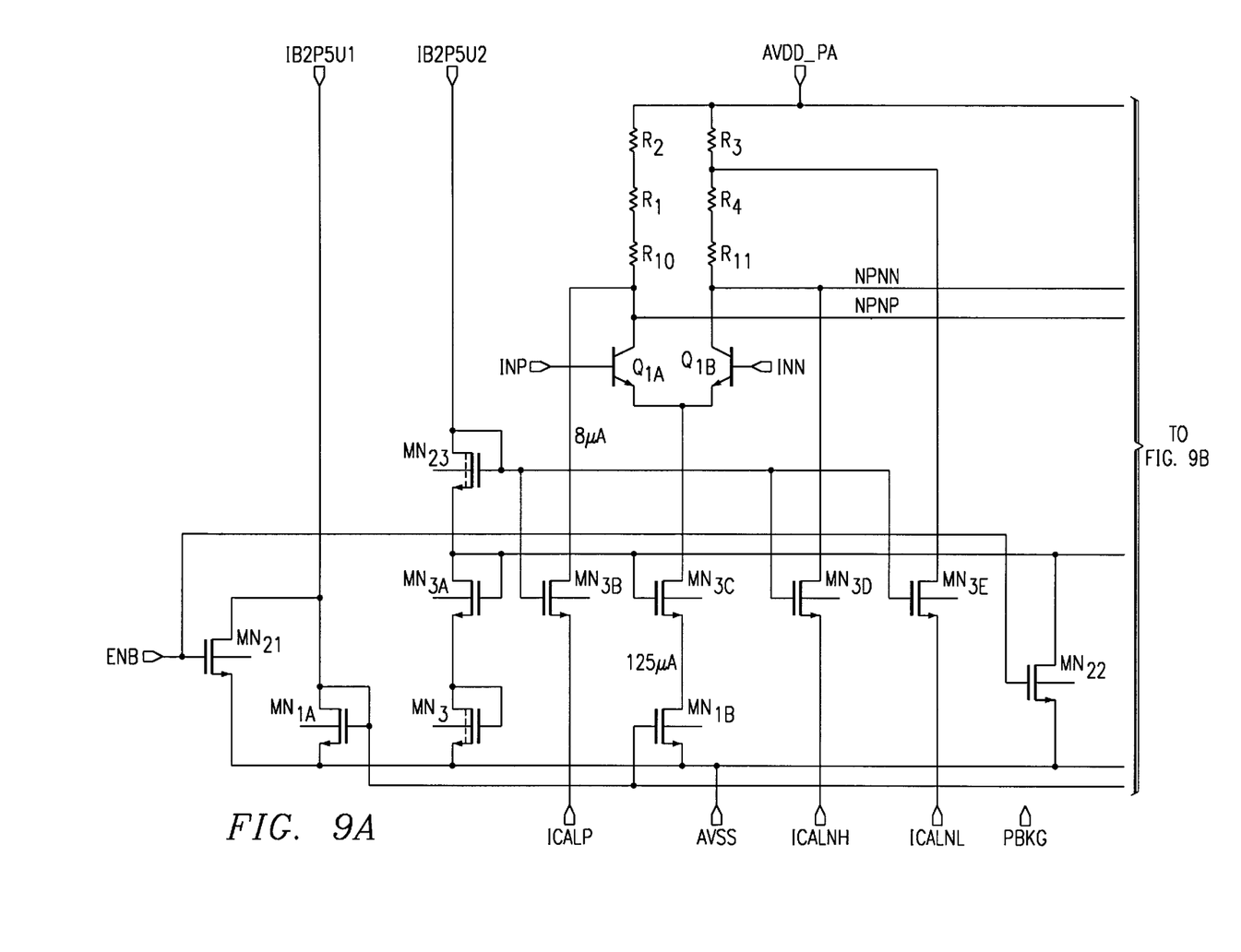
FIG. 9 is a full detailed schematic diagram of the folded-cascode amplifier of the present invention with transconductance boosting and compensation capacitors C1 and C2 with the input stage drawing similar current but having more than twice the transconductance as the conventional one.
Figure 9B:
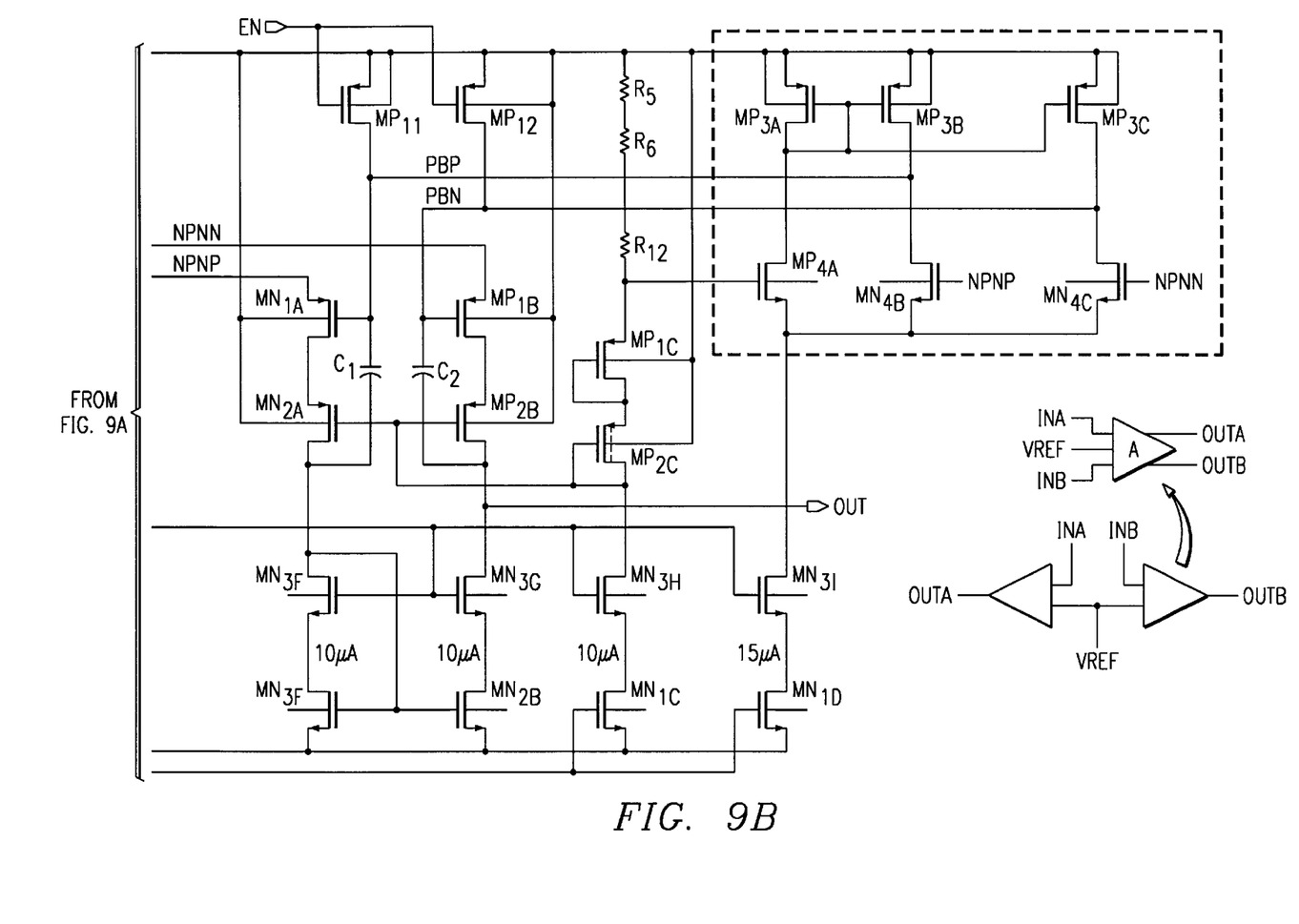

Referring now to FIG. 8, there is illustrated a fill detailed schematic diagram of a normal folded-cascode amplifier, with a full detailed schematic diagram of the present invention being depicted in FIG. 9 illustrating the additional boosting amplifiers A and compensation capacitors C1 and C2.

Figure 10:
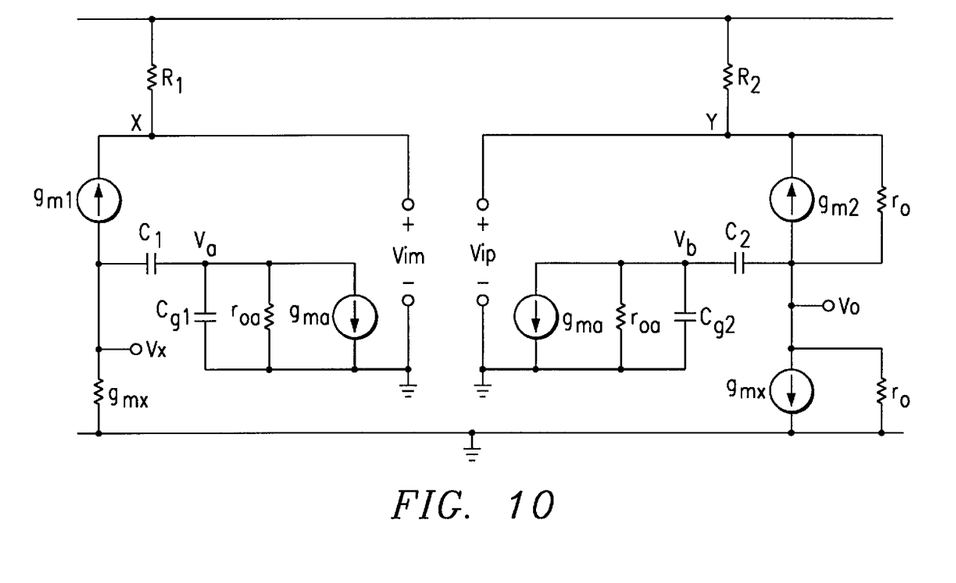
FIG. 10 is a small signal model of the circuit of FIG. 9 starting at the folding node of the amplifier.

Referring to FIG. 10, there is shown a small-signal model of the present invention depicted in FIG. 3, starting from the folding node. Upon calculation of the suitable mathematical equations, it can be reduced that the DC gain of the overall amplifier 30 is:

$$g_m/g_o \times g_{ma}/g_{oa}$$

which shows the boosting amplifiers also help the overall dc gain of the amplifier.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

What is claimed is:

1. An amplifier circuit, comprising:
   a folded-cascode circuit having an input stage having a first amplifier and an output stage responsively coupled to said input stage;
   a compensation circuit coupled to said input stage transferring small signal current gm of said input stage to the output stage, and said compensation circuit comprises at least one compensation capacitor introducing a phase shift and increasing a bandwidth of said folded-cascode circuit.

2. The amplifier circuit as specified in claim 1 further comprising two said compensation capacitors, one said compensation capacitor generating a dominant pole and a first zero and the other said compensation capacitor generating a second zero.

3. The amplifier circuit as specified in claim 2 wherein said input stage has at least one second amplifier, wherein said first zero is adapted to compensate a pole introduced by said second amplifier thereby extending the bandwidth of said folded-cascode circuit.

4. The amplifier circuit as specified in claim 3 wherein said second zero is adapted to compensate a non-dominant said pole introduced by said second amplifier.

5. An amplifier circuit, comprising:
   a folded-cascode circuit having an input stage having a first amplifier and an output stage responsively coupled to said input stage;
   a compensation circuit coupled to said input stage transferring small signal current gm of said input stage to the output stage, and said compensation circuit comprises two second amplifiers introducing two non-dominant poles, wherein said compensation circuit further comprises a first compensation capacitor introducing a first zero compensating one of said two non-dominant poles.

6. The amplifier circuit as specified in claim 5 wherein said compensation circuit further comprising a second compensation capacitor providing a second zero adapted to cancel out the second of said two non-dominate poles.

7. The amplifier circuit as specified in claim 2 wherein said capacitor introducing said dominant pole also generates a Miller Effect.

8. The amplifier circuit as specified in claim 6 wherein said second compensation capacitor also generates a small Miller Effect.

9. The amplifier circuit as specified in claim 1 wherein said first amplifier is implemented with at least one bipolar NPN transistor.

10. The amplifier circuit as specified in claim 1 wherein said input stage comprises a pair of NPN transistors each having a small signal current gm, wherein said compensation circuit transfers said gm of each NPN transistor to the output stage.

11. The amplifier circuit as specified in claim 10 wherein said input stage further comprises a second pair of transistors.

12. The amplifier circuit as specified in claim 11 wherein said second pair of transistors comprise bipolar junction transistors (BJTs).

13. The amplifier circuit as specified in claim 12 wherein said BJTs are PNP-type devices.

14. A method of operating a folded-cascode amplifier having an input stage and an output stage, comprising the steps of:

transferring a small signal current gm of the input stage to the output stage; and incorporating a first capacitor in said input stage providing a zero compensating a non-dominant pole of the output stage.

15. The method of claim 14 wherein said input stage comprises a pair of amplifiers boosting the small signal current gm of the input stage transferred to the output stage.

16. The method as specified in claim 14 further comprising the step of incorporating a second capacitor in said input stage providing a dominant pole and a small Miller Effect.

17. The method as specified in claim 14 further comprising the step of incorporating a second capacitor in said input stage providing a dominant pole and a Miller Effect.

18. The method as specified in claim 15 wherein said pair of amplifiers have a positive input, a negative input, and a shared reference.

* * * * *